United States Patent [19]
Hsue

[11] Patent Number: 5,378,654
[45] Date of Patent: Jan. 3, 1995

[54] SELF-ALIGNED CONTACT PROCESS

[75] Inventor: Chen-Chin Hsue, Hsin-Chu,

[73] Assignee: United Microelectronics Corporation, Hsinchu, Taiwan, Prov. of China

[21] Appl. No.: 249,306

[22] Filed: May 24, 1994

[51] Int. Cl.⁶ ............................................. H01L 21/44
[52] U.S. Cl. ................................. 437/195; 437/200; 437/52; 437/60; 437/919
[58] Field of Search ............... 437/195, 192, 200, 203, 437/52, 919, 48, 49, 51, 60

[56] References Cited

U.S. PATENT DOCUMENTS

| | | | |
|---|---|---|---|
| 4,766,006 | 8/1988 | Gaczi | 437/200 |
| 5,037,777 | 8/1991 | Mele et al. | 437/195 |
| 5,066,606 | 11/1991 | Lee | 437/52 |
| 5,082,797 | 1/1992 | Chan et al. | 437/52 |
| 5,116,776 | 5/1992 | Chan et al. | 437/52 |
| 5,149,668 | 9/1992 | Rhodes et al. | 437/52 |
| 5,155,056 | 10/1992 | Jeong-Gyoo | 437/47 |

Primary Examiner—Brian E. Hearn
Assistant Examiner—Tuan Nguyen
Attorney, Agent, or Firm—George O. Saile; Grahan S. Jones, II

[57] ABSTRACT

A method of forming a self-aligned contact on a device including a semiconductor substrate comprises the steps of forming a gate oxide layer on the substrate, forming a gate electrode layer on the gate oxide layer, forming a stacked dielectric structure stacked on the gate electrode layer, and then patterning the stacked dielectric structure and the gate electrode layer, forming a dielectric layer blanketing the device, forming a first mask over the dielectric layer, the first mask covering a masked region, and then etching the dielectric layer through the mask to form a self-aligned contact opening into the dielectric layer leaving a first dielectric spacer adjacent to the stacked gate electrode and leaving the masked region covered by the remainder of the dielectric layer, removing the first mask, deposition of a second electrode layer, then forming a second mask and patterning the electrode layer by etching through the second mask, thereby forming a self-aligned contact structure in the opening.

19 Claims, 5 Drawing Sheets

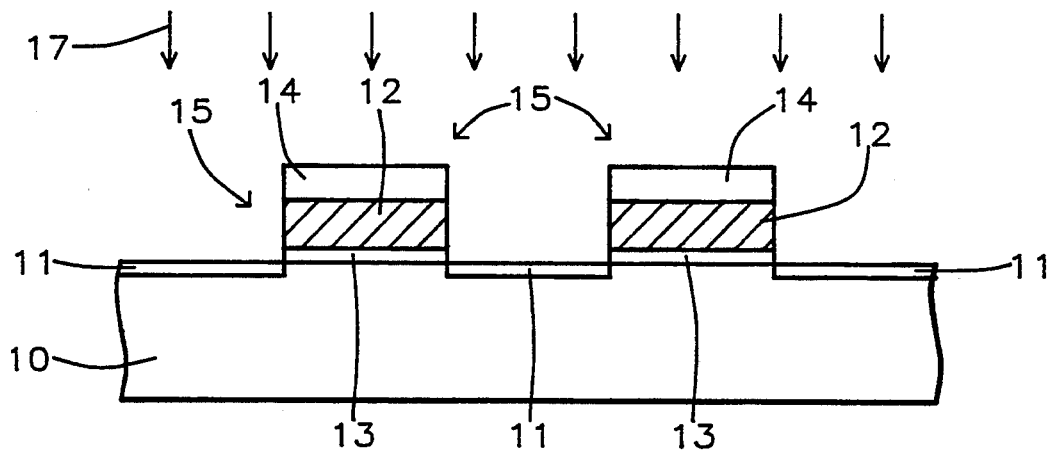
FIG. 1A — Prior Art
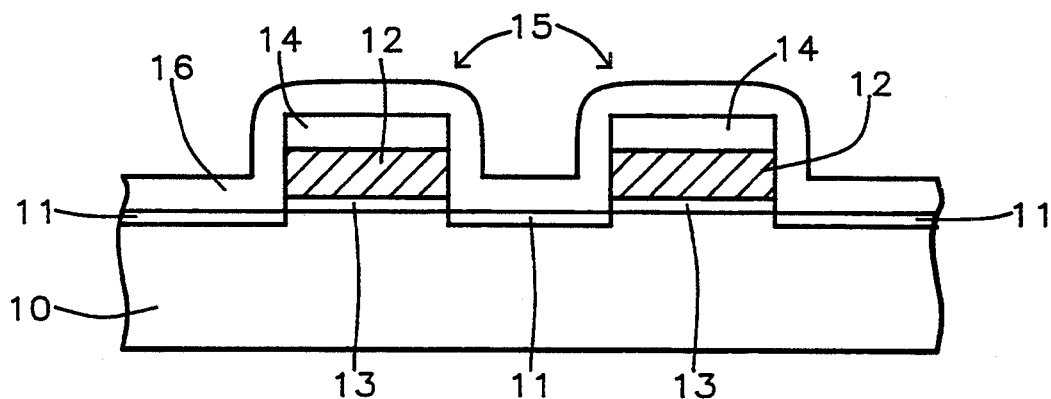
FIG. 1B — Prior Art
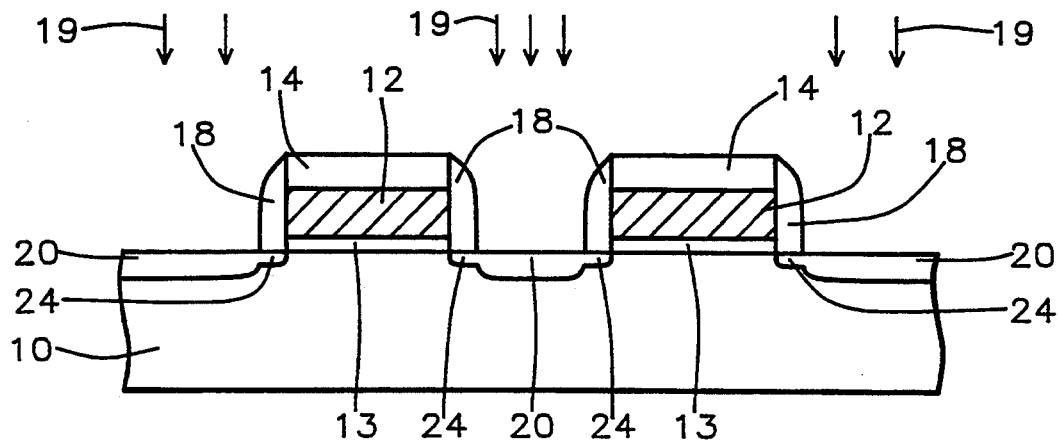
FIG. 1C — Prior Art

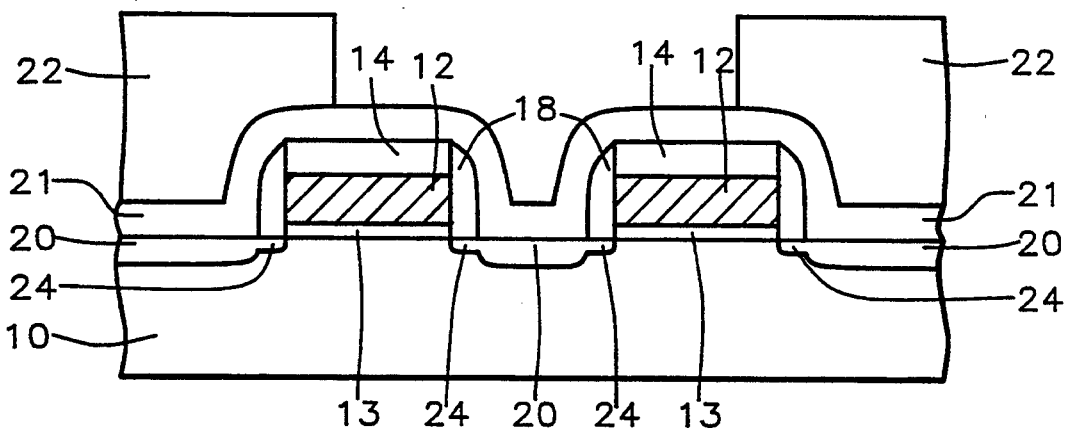
FIG. 1D – Prior Art
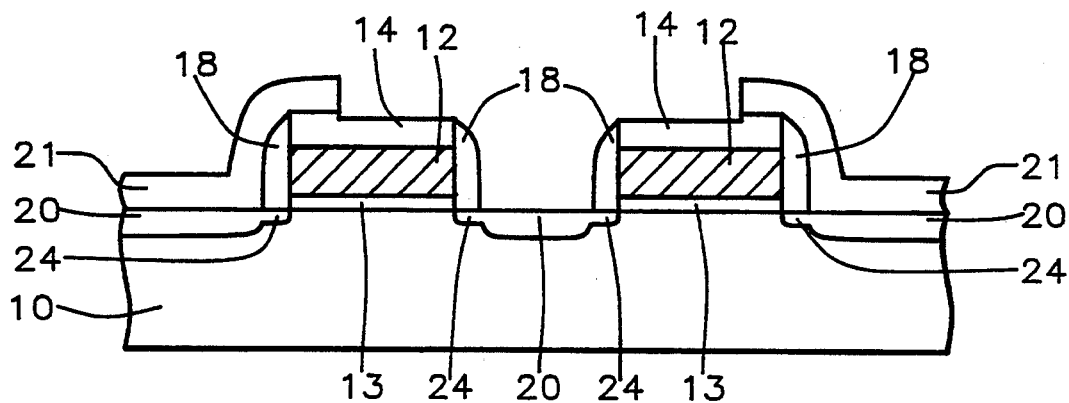
FIG. 1E – Prior Art
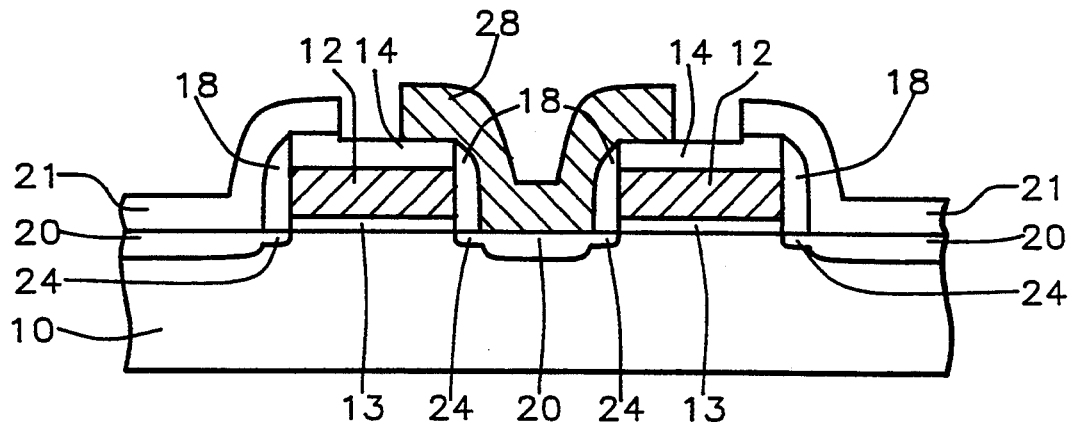
FIG. 1F – Prior Art

SELF-ALIGNED CONTACT PROCESS

BACKGROUND OF THE INVENTION

1. Field of the Invention

This invention relates to MOSFET devices and more particularly to an improved process of manufacture.

2. Description of Related Art

A conventional Self-Aligned Contact (SAC) process uses a thick cap layer over polysilicon gate structures. The cap layer is composed silicon dioxide material for spacer and SAC contact etching back. The process window is a trade off with increased step height.

N/P MOS devices are formed before SAC formation, so the thermal cycling of devices increases, affecting the device margin.

U.S. Pat. No. 5,116,776 of Chan et al, "Method of Making a Stacked Capacitor for DRAM Cell" and U.S. Pat. No. 5,155,056 of Jeony-Gyoo for "Process for Formation of Cells Having Self-Aligned Capacitor Contacts, and Structure Thereof" show methods for making a DRAM device including a self-aligned contact for the capacitor.

Referring to FIGS. 1A–1F a conventional SAC process is illustrated by a series of cross sectional views of a device in the process of manufacture.

Referring to FIGS. 1A–1E a prior art process is illustrated by a series of cross sectional views of a device in accordance with a prior art process of manufacture.

FIG. 1A shows a process of prior art polysilicon gate definition and N− implant.

In FIG. 1A a prior art process includes a substrate 10 composed of lightly doped P-well or P-substrate silicon semiconductor material. The substrate 10 was processed to achieve the result shown in FIG. 1A. First, a silicon dioxide gate oxide layer 13 having a thickness of about 150 Å is deposited. Then a polysilicon or polycide layer 12 is formed. Next, a silicon dioxide layer 14 is formed.

The polysilicon or polycide layer 12 and the silicon dioxide layer 14 are then patterned to form polysilicon gate structures 15 as shown in FIG. 1A by photolithography and etching.

Next N− dopant ions 17 composed of phosphorus ($P^{31}$) or arsenic (As+) are implanted into N− regions 11 of substrate 10. The dopant is applied to provide counter-doping at a far higher level of doping than in the remainder of P-sub 10. The result is N− implanted regions 11, in the surface of the P− substrate 10 between the polysilicon or polycide layer gate structures 15.

FIG. 1B shows the result of prior art CVD silicon dioxide deposition. In FIG. 1B the result of the prior art deposition process is shown after CVD (chemical vapor deposition) of silicon dioxide ($SiO_2$) to form a blanket spacer layer 16. The $SiO_2$ layer 16 is preferably deposited in a CVD reactor.

FIG. 1C shows the result of prior art spacer etching (blank etching) N+doping. In particular, FIG. 1C shows spacers 18 formed from spacer oxide layer 16 as the result of an anisotropic blanket etching back process (without a mask) of RIE (reactive ion etching) with an oxide etcher during which regions 11 of substrate 10 are exposed between the spacers 16.

Next, dopant N+ ions 19 are implanted through the spaces between gate structures 15 into regions 20 and shallow N− regions 24 of substrate 10. The dopant applied is arsenic (As+.)

FIG. 1D shows the product of FIG. 1C after the result of prior art CVD silicon dioxide deposition and formation a SAC mask a CVD deposit of silicon dioxide ($SiO_2$) layer 21. The $SiO_2$ layer 21 is deposited in a CVD reactor. The CVD process employs a reactant gas(es) consisting of silane and oxygen $O_2$.

Next, an SAC (Self Aligned Contact) mask for the CVD silicon dioxide $SiO_2$ layer 21 is formed by depositing a blanket layer of photoresist, which is exposed and developed to produce the mask 22 leaving the central portion of the device in FIG. 1D exposed.

FIG. 1E shows the result of prior art formation of a SAC contact opening in the CVD silicon oxide layer 21. An etching process has patterned a portion of the silicon dioxide layer 21 exposed through mask 22 to open up a portion of the surface of N+ doped region 20. Plasma etching is employed using a conventional anisotropic oxide etchant. Then process steps follow comprising deposition of a polysilicon 2 layer, formation of a polysilicon 2 mask, and polysilicon 2 etching.

FIG. 1F shows the result of prior art polysilicon 2 deposition and polysilicon 2 definition for SAC (Self Aligned Contact) formation. The polysilicon 2 or polycide SAC contact 28 is deposited in contact with the surface of N+ doped region 20. The SAC contact 28 has been defined in the configuration shown.

SUMMARY OF THE INVENTION

The problem that is to be solved by this invention is that thick cap of silicon dioxide over the polysilicon gate suffers only from the Self-Aligned Contact (SAC) etch back. In addition, the process margin is increased and the step coverage is improved.

In addition, the N/P MOS regions are formed after SAC contact formation, so this invention is compatible with other existing processes.

In accordance with this invention, fewer process steps are required and the process is simple and cost effective.

In accordance with this invention a method is provided for forming a self-aligned contact on a device including a semiconductor substrate. The method comprises the steps of forming a gate oxide layer on the substrate, forming a gate electrode layer on the gate oxide layer, forming a stacked dielectric structure stacked on the gate electrode layer, and then patterning the stacked dielectric structure and the gate electrode layer, forming a dielectric layer blanketing the device, forming a first mask over the dielectric layer, the first mask covering a masked region, and then etching the dielectric layer through the mask to form a self-aligned contact opening into the dielectric layer leaving a first dielectric spacer adjacent to the stacked gate electrode and leaving the masked region covered by the remainder of the dielectric layer, removing the first mask, deposition of a second electrode layer, then forming a second mask and patterning the electrode layer by etching through the second mask, thereby forming a self-aligned contact structure in the opening.

Preferably, the stacked dielectric comprises silicon dioxide or silicon nitride, the gate electrode layer comprises polysilicon, polycide, $WSi_2$, or $MoSi_2$; the silicon dioxide is deposited by chemical vapor deposition; the etching of the self-aligned contact opening into the spacer layer is performed by anisotropic reactive ion etching; the self-aligned contact structure comprises a polycide selected from the group consisting of $WSi_2$ and $MoSi_2$; an ion implantation process is applied to the self-aligned contact structure in the opening, then the remainder of the spacer layer is etched away leaving additional spacers adjacent to exposed surfaces of the substrate, followed by ion implantation of dopant into the substrate through the exposed surfaces; the ion implantation is diffused to form a N+ region within the particular N− region beneath the self-aligned contact structure in the opening; the spacer layer is formed by chemical vapor deposition of silicon dioxide; and the spacer layer is formed by chemical vapor deposition of silicon dioxide; the spacer layer is formed by chemical vapor deposition of silicon dioxide; the gate electrode layer comprises a material selected from the group consisting of polysilicon and polycide; the polycide is selected from the group consisting of $WSi_2$ and $MoSi_2$; and the spacer layer is formed by chemical vapor deposition of silicon dioxide.

BRIEF DESCRIPTION OF THE DRAWINGS

The foregoing and other aspects and advantages of this invention are explained and described below with reference to the accompanying drawings, in which:

FIG. 1A shows a process of prior art polysilicon gate definition and N− implant.

FIG. 1B shows the result of prior art CVD silicon dioxide deposition.

FIG. 1C shows the result of prior art spacer etching (blank etching) N+ doping.

FIG. 1D shows the result of prior art CVD silicon dioxide deposition and formation of a SAC mask.

FIG. 1E shows the result of prior art SAC opening in the CVD oxide layer.

FIG. 1F shows the result of prior art polysilicon 2 deposition and polysilicon 2 definition for SAC (Self Aligned Contact) formation.

FIG. 2A illustrates the result of a polysilicon gate definition and N− implant.

FIG. 2B shows the product of FIG. 2A after CVD silicon dioxide deposition and formation of a SAC mask.

FIG. 2C shows the product of FIG. 2B after spacer etching with a SAC mask.

FIG. 2D shows the product of FIG. 2C after deposition of a polysilicon 2 or polycide electrode layer.

FIG. 2E shows the product of FIG. 2D after etching of the electrode layer and ion implantation into the electrode layer.

FIG. 2F shows the product of FIG. 2E after spacer etching and N+ doping.

DESCRIPTION OF THE PREFERRED EMBODIMENT

FIGS. 2A–2F are cross sectional views illustrating a series of steps in a SAC process of manufacture of a device in accordance with this invention.

Figure 2A:
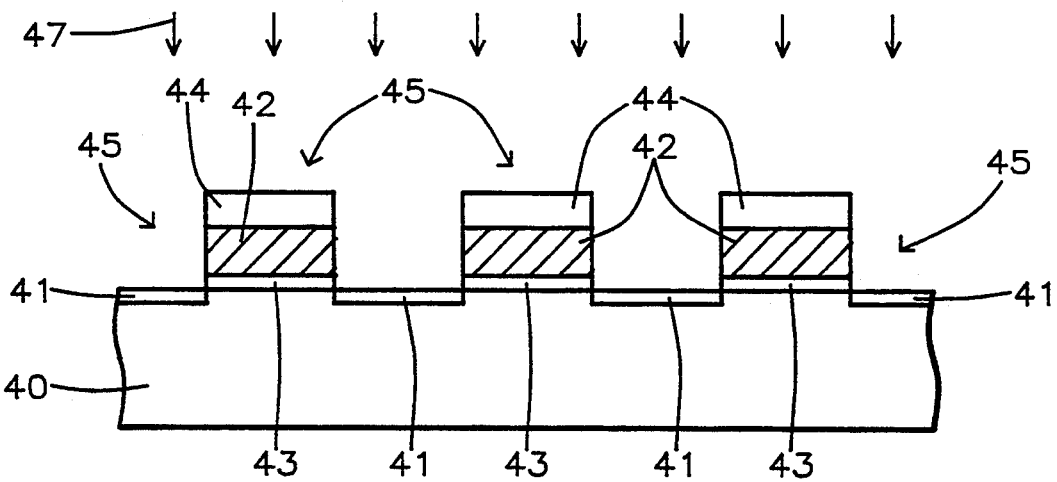
FIGS. 2A–2F are cross sectional views illustrating a series of steps in a SAC process of manufacture of a device in accordance with this invention.

FIG. 2A shows a substrate 40 composed of lightly doped P-well or P-substrate silicon semiconductor material. The substrate 40 was processed to achieve the result shown in FIG. 2A. Next, a silicon dioxide layer 43 having a thickness of about 150 Å is deposited, preferably by means of chemical vapor deposition. Then a polysilicon or polycide ($WSi_2$, or $MoSi_2$) layer 42 is formed having a thickness of about 3,000 Å. Subsequently, a stacked gate dielectric layer 44 composed of silicon dioxide or silicon nitride 44 having a thickness of about 2,000 Å is formed.

The polysilicon or polycide layer 42 and the stacked gate dielectric layer 44 are then patterned to form polysilicon gate structures 45 as shown in FIG. 2A.

Next N− dopant ions 47 composed of phosphorus ($P^{31}$) or arsenic (As+) are implanted into N− regions 41 of substrate 40. The dopant is applied at a preferred dose of $2 \times 10E13$ cm$^{-2}$ at a preferred energy of 60 keV to provide counter-doping at a far higher level of doping than in the remainder of P-sub 40. A range of energies from about 40 keV to about 80 keV is possible. A range of doses from about $5 \times 10E12$ cm$^{-2}$ to about $5 \times 10E13$ cm$^{-2}$ is possible. The result is implanted N− regions 41, having a thickness of about 1,000 Å, in the surface of the P− substrate 40 between the polysilicon or polycide layer gate structures 45.

Figure 2B:
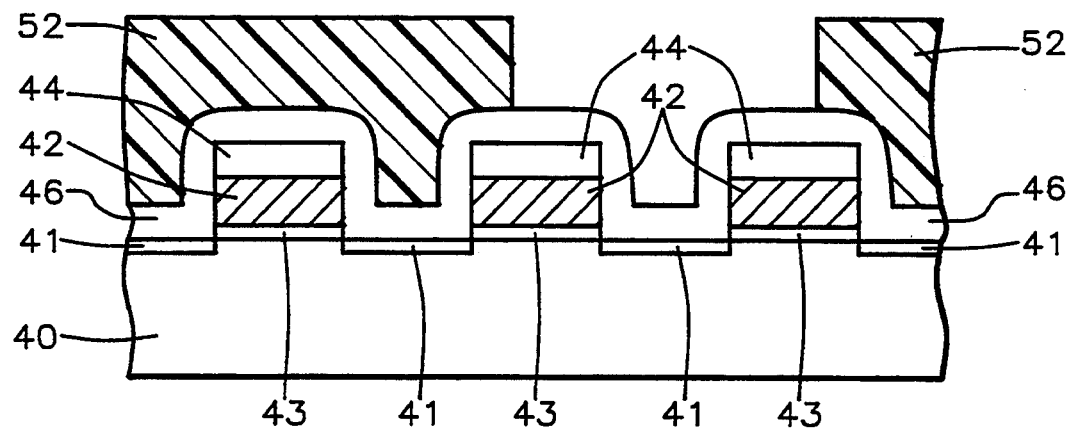

FIG. 2B shows the result of several process steps. First, as in FIG. 1B, a deposition process for applying silicon dioxide ($SiO_2$), preferably by CVD (chemical vapor deposition), provides spacer layer 46. The $SiO_2$ layer 46 is preferably deposited in a CVD reactor at a temperature of from about 400° C. to about 800° C. to a thickness of about 2500 Å.

Next, unlike the process of FIG. 1B, over spacer $SiO_2$ layer 46, in FIG. 2B a SAC (Self Aligned Contact) mask 52 for the $SiO_2$ spacer layer 46 is formed by depositing a blanket layer of unexposed photoresist 52, which is exposed and developed to produce the mask 52 leaving the central portion of the right half of the device in FIG. 2B exposed.

Figure 2C:
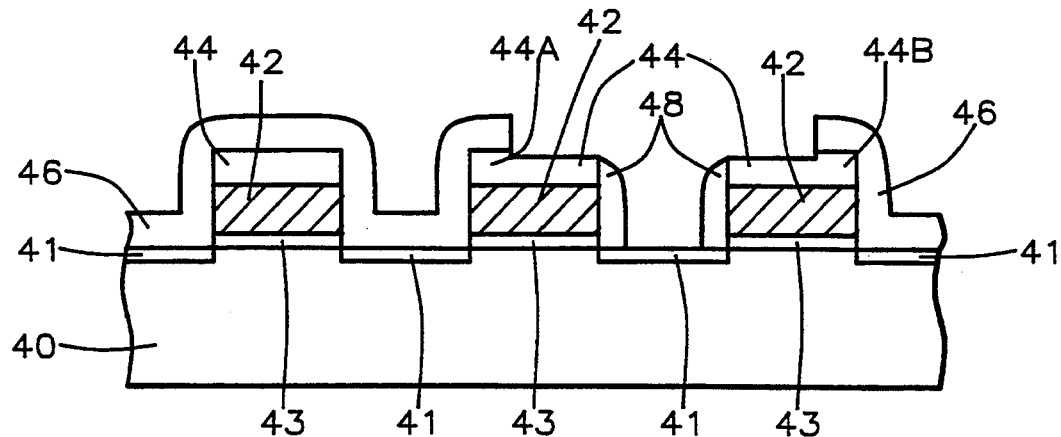

FIG. 2C shows the device of FIG. 2B with the remainder of the mask 52 removed. Prior to removal of mask 52, first spacers 48 were formed in the central portion of the right half of the device in FIG. 2C from spacer oxide layer 46 as the result of an etching process (with areas to be protected covered by mask 52) of anisotropic RIE (reactive ion etching) with an oxide etcher with the remainder of layer 46 being protected by mask 52. During the RIE etching, regions 41 of substrate 40 are exposed between the first spacers 48. In addition, spacer layer 46 remains on either side of the central portion of the right half of the device, where the mask 52 provided protection.

Figure 2D:
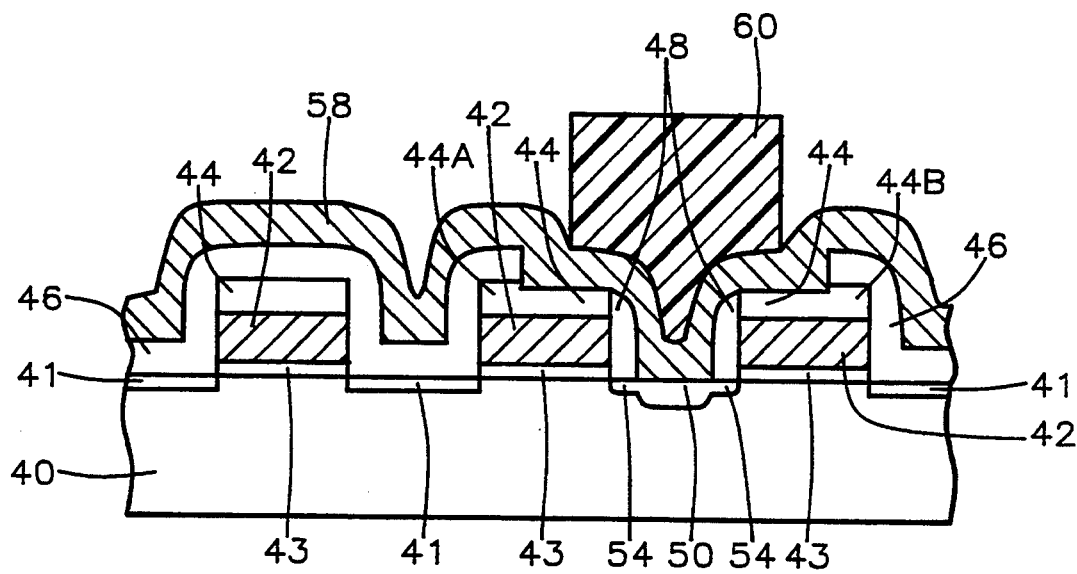

FIG. 2D shows the product of FIG. 2C after deposition of a SAC (Self-Aligned Contact) polysilicon 2 or polycide electrode composed of ($WSi_2$, $MoSi_2$) to serve as a contact 58 to the device of FIG. 2C in the space between spacer layers 48. The metal layer 58 for a SAC contact is in contact with the surface of N+ doped region 20. A second photoresist mask 60 is formed over the metal layer 58 to pattern the SAC contact.

Figure 2E:
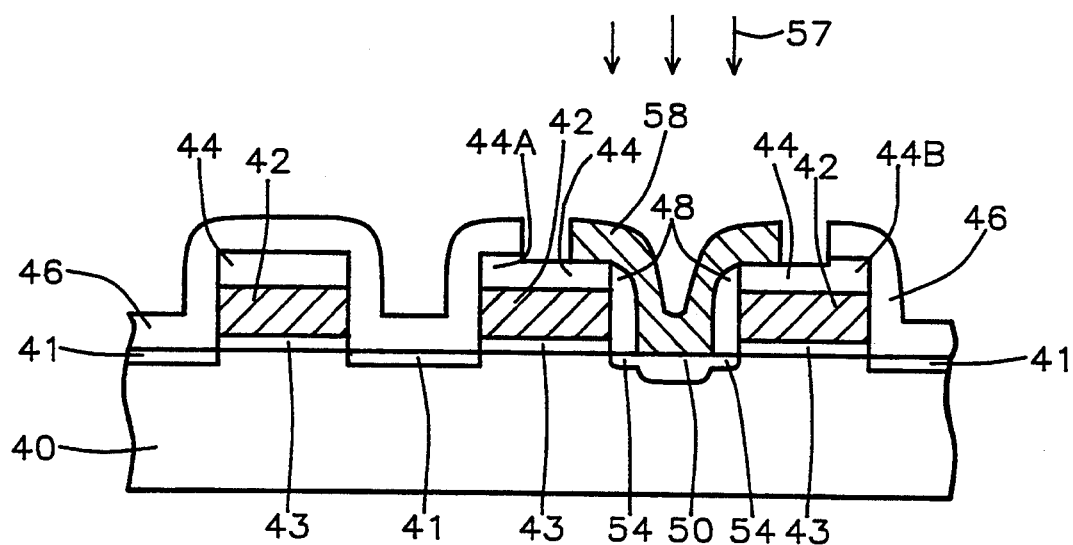

FIG. 2E shows the product of FIG. 2D after etching of said electrode layer 58 into the pattern of the SAC contact. Next, as shown in FIG. 2E follows the process of N+ doping by ion implantation of ions 57 into the SAC contact 58, simultaneously without diffusion from polysilicon 2 or polycide SAC contact 58 ion implantation to form N+ region 50 within the particular N− region 41 between the first spacers 48.

Figure 2F:
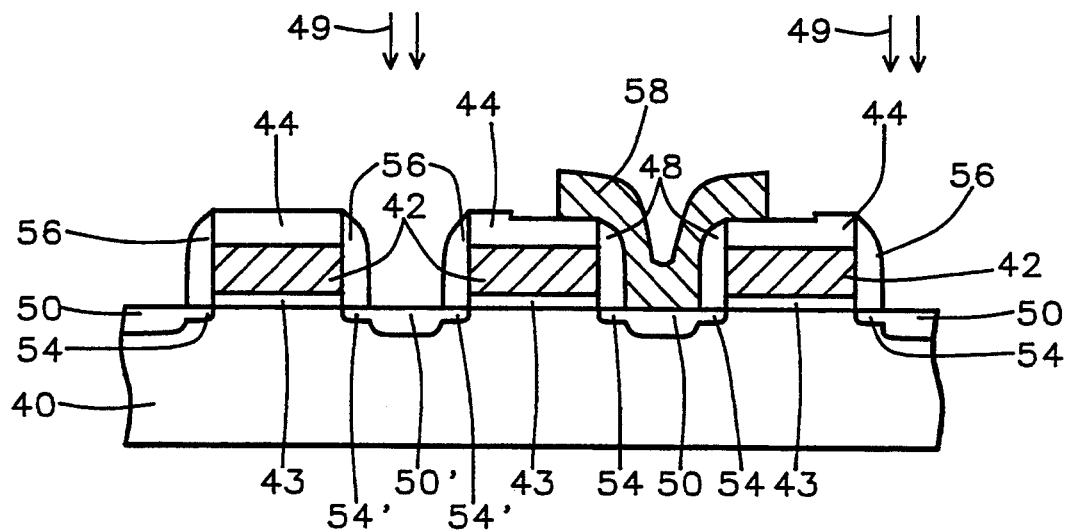

FIG. 2F shows the product of FIG. 2E after spacer etching and N+ doping. In FIG. 2F a spacer etching process etches away the remainder of $SiO_2$ spacer layer 46 leaving second spacers 56 on the left above the N− region 41, which has been converted into N+ region 50′. Layer 46 is etched without a mask opening up the surface of remaining N− doped region 41 adjacent to the SAC contact 58. Plasma etching is employed using an RIE anisotropic etch.

Next, dopant N+ ions 49 are implanted through the opening between second spacers 56 into N+ region 50' and shallow N+ regions 54' of substrate 40. The dopant ions 49 are applied at a preferred dose of $5 \times 10E15$ cm$^{-2}$ of arsenic (As+) at a preferred energy of 80 keV to provide a far higher level of doping than in the remainder of the device. A range of energies from about 50 keV to about 50 keV is possible. A range of doses from about $1 \times 10E15$ cm$^{-2}$ to about $8 \times 10E15$ cm$^{-2}$ is possible.

Then ion implantation into region 41 of FIG. 2E produced N+ doped region 50' between second spacers 56 with N+ dopant is performed.

In summary, some critical features of this invention are as follows:
1. The sequence of steps for forming a SAC structure of self aligned contacts,
2. Only one silicon dioxide etching step in the SAC device area,
3. Spacer formation etches for both
   a. the SAC region 58 and
   b. the other device regions 50'.
4. With respect to FIG. 2E, an important alternative is the spacer etching step an N+ ion implantation step or diffusion to the outdiffusion from polysilicon 2 layer shown in FIG. 2E.
5. A further critical process feature is that this invention uses the spacer oxide to protect other device regions during SAC formation rather than the conventional process which requires extra oxide, i.e. two oxide layers.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a self-aligned contact on a device including a semiconductor substrate comprising the steps as follows:
   forming a gate oxide layer on said substrate,
   forming a gate electrode layer on said gate oxide layer,
   forming a stacked dielectric structure stacked on said gate electrode layer, and then patterning said stacked dielectric structure and said gate electrode layer to form a stacked gate electrode,
   forming a dielectric layer blanketing said device,
   forming a first mask over said dielectric layer, said first mask covering a masked region, and then etching said dielectric layer through said mask to form a self-aligned contact opening into said dielectric layer leaving a first dielectric spacer adjacent to said stacked gate electrode and leaving said masked region covered by the remainder of said dielectric layer,
   removing said first mask,
   depositing a second electrode layer over said dielectric layer having said contact opening,
   then forming a second mask and patterning said second electrode layer by etching through said second mask, thereby forming a self-aligned contact structure in said opening, and
   applying an ion implantation process to said self-aligned contact structure in said opening, then the remainder of said dielectric layer is etched away leaving additional spacers adjacent to exposed surfaces of said substrate, and followed by ion implantation of dopant into said substrate through said exposed surfaces.

2. A method in accordance with claim 1 wherein said stacked dielectric comprises silicon dioxide.

3. A method in accordance with claim 1 wherein said stacked dielectric comprises silicon nitride.

4. A method in accordance with claim 1 wherein said gate electrode layer comprises polysilicon.

5. A method in accordance with claim 1 wherein said gate electrode layer comprises polycide.

6. A method in accordance with claim 5 wherein said gate electrode layer comprises WSi$_2$.

7. A method in accordance with claim 5 wherein said gate electrode layer comprises MoSi$_2$.

8. A method in accordance with claim 1 wherein said dielectric layer is silicon dioxide and it is deposited by chemical vapor deposition.

9. A method in accordance with claim 1 wherein said etching of said self-aligned contact opening into said dielectric layer is performed by anisotropic reactive ion etching.

10. A method in accordance with claim 1 wherein said self-aligned contact structure comprises a polycide selected from the group consisting of WSi$_2$ and MoSi$_2$.

11. A method in accordance with claim 1 wherein said ion implantation is diffused to form a N+ region beneath said self-aligned contact structure in said opening.

12. A method in accordance with claim 11 wherein said dielectric layer is formed by chemical vapor deposition of silicon dioxide.

13. A method in accordance with claim 11 wherein said ion implantation is diffused to form a N+ region beneath said self-aligned contact structure in said opening.

14. A method in accordance with claim 13 wherein said dielectric layer is formed by chemical vapor deposition of silicon dioxide.

15. A method in accordance with claim 11 wherein said dielectric layer is formed by chemical vapor deposition of silicon dioxide.

16. A method in accordance with claim 11 wherein said gate electrode layer comprises a material selected from the group consisting of polysilicon and polycide.

17. A method in accordance with claim 16 wherein said polycide is selected from the group consisting of WSi$_2$ and MoSi$_2$.

18. A method in accordance with claim 17 wherein said dielectric layer is formed by chemical vapor deposition of silicon dioxide.

19. A method in accordance with claim 1 wherein said dielectric layer is formed by chemical vapor deposition of silicon dioxide.

* * * * *